(12) United States Patent
Sutanthavibul et al.

(10) Patent No.: US 10,333,379 B2
(45) Date of Patent: Jun. 25, 2019

(54) POWER SWITCHING CIRCUITRY INCLUDING POWER-UP CONTROL

(71) Applicant: Intel Corporation, Santa Clara, CA (US)

(72) Inventors: Suphachai Chai Sutanthavibul, El Dorado Hills, CA (US); Iqbal Rajwani, Roseville, CA (US); Anupama A Thaploo, Folsom, CA (US); Surya Sasi Kiran Tallapragada, Rancho Cordova, CA (US); Daivik H Bhatt, Folsom, CA (US); Lei Jiang, Camas, WA (US); Stephen Kim, Hillsboro, OR (US); Pascal A. Meinerzhagen, Hillsboro, OR (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 172 days.

(21) Appl. No.: 15/382,076

(22) Filed: Dec. 16, 2016

(65) Prior Publication Data

US 2018/0175832 A1    Jun. 21, 2018

(51) Int. Cl.
*H02M 1/08*    (2006.01)
*H03K 17/0812*  (2006.01)
(Continued)

(52) U.S. Cl.
CPC ............. *H02M 1/08* (2013.01); *H02M 1/088* (2013.01); *H02M 3/158* (2013.01);
(Continued)

(58) Field of Classification Search
CPC .................. H02M 1/08; H02M 1/088; H02M 3/156–158; H02M 3/1584; H02M 2001/0032; H02M 2001/0048; H03K 17/08104; H03K 17/08122; H03K 17/687; H03K 17/6871; H03K 19/00113;
(Continued)

(56) References Cited

U.S. PATENT DOCUMENTS 7,696,649 B2 *   4/2010   Frey ........................ H03K 17/28
                                                          307/139
7,902,914 B2 *   3/2011   Kawasaki ........ H03K 19/00369
                                                          327/313
(Continued)

OTHER PUBLICATIONS

Fayneh, Eyal, et al., "14nm 6th-Generation Core Processor SoC with Low Power Consumption and Improved Performance", ISSCC 2016 / Session 4 / Digital Processors / 4.1, (2016), 3 pgs.
(Continued)

*Primary Examiner* — Patrick O Neill
(74) *Attorney, Agent, or Firm* — Schwegman Lundberg & Woessner, P.A.

(57) ABSTRACT

Some embodiments include apparatuses and methods using the apparatuses. One of the apparatuses includes a first power supply node, a second power supply node, transistors coupled in parallel between the first and second power supply nodes, and a controller to provide a first voltage, a second voltage, and a third voltage to gates of the transistors based on digital information. The first, second, and third voltages have different values based on values of the digital information.

22 Claims, 8 Drawing Sheets

(51) Int. Cl.
*H03K 17/687* (2006.01)
*H02M 3/158* (2006.01)
*H02M 1/088* (2006.01)
*H03K 19/00* (2006.01)
*H02M 1/00* (2006.01)
*H03K 17/08* (2006.01)

(52) U.S. Cl.
CPC ... *H03K 17/08122* (2013.01); *H03K 17/6871* (2013.01); *H03K 19/0013* (2013.01); *H03K 19/0016* (2013.01); *H02M 2001/0032* (2013.01); *H02M 2001/0048* (2013.01); *H03K 2017/0806* (2013.01); *H03K 2217/0036* (2013.01); *Y02B 70/1491* (2013.01)

(58) Field of Classification Search
CPC ....... H03K 19/0016; H03K 2017/0806; H03K 2217/0036; H03K 2217/0063
See application file for complete search history.

(56) References Cited

U.S. PATENT DOCUMENTS

| | | | |
|---|---|---|---|
| 8,823,445 B2* | 9/2014 | Choy | G11C 5/147 |
| | | | 327/541 |
| 8,963,627 B2* | 2/2015 | Lundberg | H03K 19/0016 |
| | | | 327/544 |
| 9,007,122 B2* | 4/2015 | Lundberg | G06F 1/3234 |
| | | | 327/544 |
| 9,614,386 B2* | 4/2017 | Sutardja | H02J 7/0052 |
| 9,755,631 B2* | 9/2017 | Shim | H03K 3/0377 |
| 2017/0083033 A1* | 3/2017 | Park | G05F 1/575 |
| 2018/0032124 A1* | 2/2018 | Fukuoka | G06F 1/3206 |

OTHER PUBLICATIONS

Kim, Suhwan, et al., "Understanding and Minimizing Ground Bounce During Mode Transition of Power Gating Structures", ZSLPED'03, Aug. 25-27, 2003, Seoul, Korea., (2003), 22-25.

* cited by examiner

202

US 10,333,379 B2

POWER SWITCHING CIRCUITRY INCLUDING POWER-UP CONTROL

TECHNICAL FIELD

Embodiments described herein pertain to supply power in integrated circuits. Some embodiments relate to control of supply power in integrated circuits in different modes.

BACKGROUND

Many electronic systems (e.g., computers and cellular phones) have operations that disconnect supply power from a particular part of a device in the system during some modes (e.g., an inactive mode) of the device to save power. Such electronic systems also have reconnection operations to reconnect power supply to that particular part of the device in another mode (e.g., an active mode) of the device. In some conventional systems, designing components (e.g., circuitry) to perform such reconnection operations with minimal side effects may pose a challenge.

DETAILED DESCRIPTION

The techniques described herein include an IC having a functional unit and a power switching circuitry to control delivery of power to the functional unit in different operating states of the functional unit. The techniques described herein include many improvements over some conventional techniques that involve control of supply power in electronic devices and systems. For example, some of the information (e.g., digital codes) used during part of the operations of the described power switching circuitry can be programmable (e.g., post-silicon programming). This avoids calibration (e.g., post-silicon trimming) of components associated with the power switching circuitry. The structures and operations of components (e.g., power switching circuitry) used in the described techniques can help reduce or avoid excessive heat that may occur at some part (e.g., transistors) of the components. The described techniques can help reduce voltage droops and noise in supply voltages, and reduce electro-migration in metal structures that are used to deliver current to some power supply nodes of the IC. The described techniques can make some relationships of the components (e.g., resistor ratios) of the described power switching circuitry insensitive to process-voltage-temperature (PVT) variations. This may improve current profiles in some operational modes of the described power switching circuitry. Other improvements are described below.

Figure 1A:
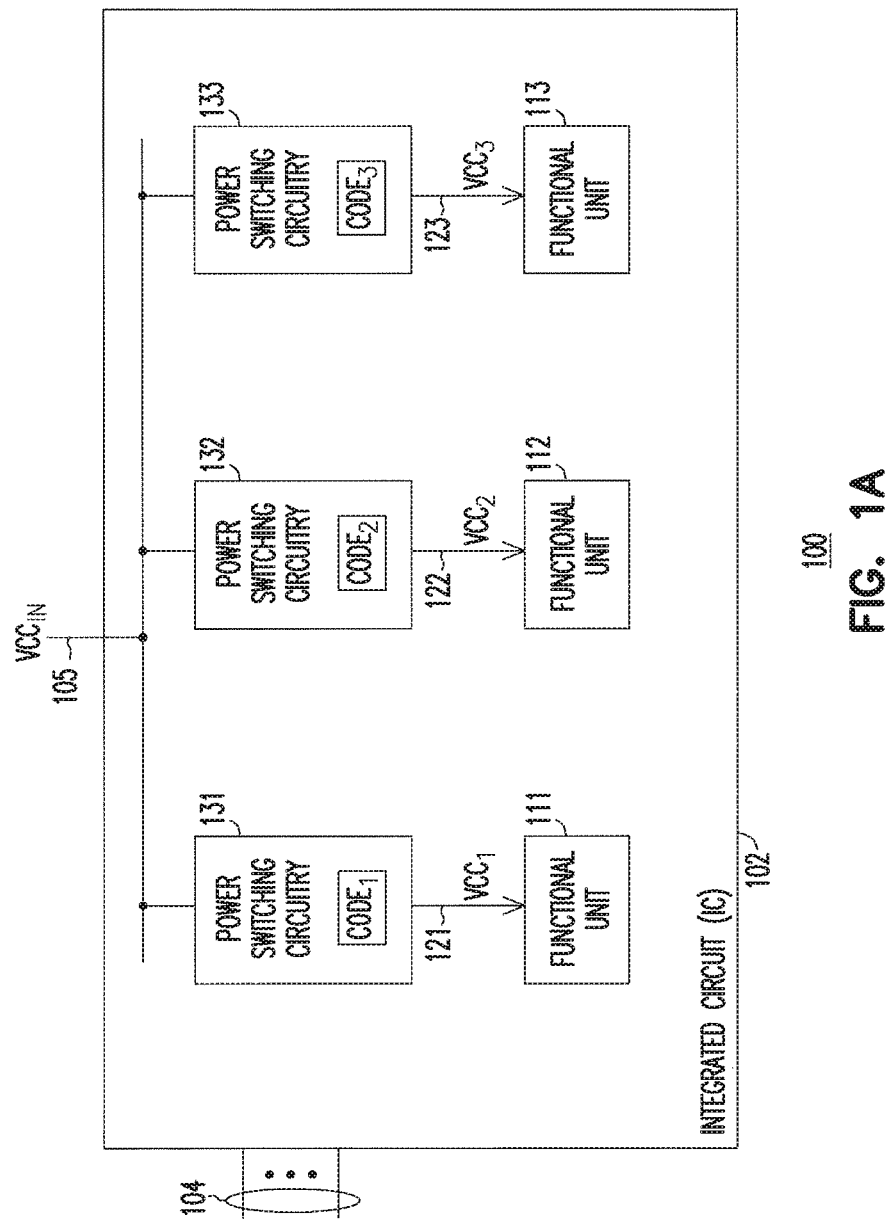
FIG. 1A shows an apparatus including an integrated circuit (IC) having power switching circuitry and functional units, according to some embodiments described herein.

FIG. 1A shows an apparatus 100 including an IC 102 having power switching circuitry 131, 132, and 133, and functional units 111, 112, and 113, according to some embodiments described herein. Apparatus 100 can include or be included in an electronic device or system. Examples of such devices or systems include computers (e.g., servers, desktops, laptops, and notebooks), tablets, cellular phones, wearable electronic things, and other electronic devices or systems.

IC 102 can include an IC die (e.g., semiconductor (e.g., silicon) die (e.g., a chip)) where components of IC 102 are located. Examples of IC 102 include a general purpose processor (e.g., a microprocessor), a graphics processor, a microcontroller, an application-specific integrated circuit (ASIC), a system-on-chip (SoC), and other electronic devices or systems.

Functional units 111, 112, and 113 can include or can be parts of a graphics processor (e.g., execution unit) or core (e.g., central processing unit (CPU)) of a processor, a memory cell array, and other types of functional units (e.g., functional units inside a processor). FIG. 1A shows IC 102 including three functional units 111, 112, and 113 as an example. However, the number of functional units in IC 102 can vary.

As shown in FIG. 1A, apparatus 100 can include a power supply node 105 to receive a voltage $VCC_{IN}$ (e.g., un-gated power supply voltage) and power supply nodes 121, 122, and 123 to provide voltages (e.g., gated power supply voltages) $VCC_1$, $VCC_2$, and $VCC_3$. Power supply node 105 can be part of a supply power rail (e.g., un-gated $V_{CC}$ power rail) of apparatus 100 that can receive supply power from a battery (not shown) through a power path coupled to the battery (not shown in FIG. 1A). Such a power path may include a voltage regulator, which can receive power from the battery and generate a regulated voltage (e.g., voltage $VCC_{IN}$). Thus, in FIG. 1A, voltage $VCC_{IN}$ can be a regulated supply voltage (e.g., provided at an output of a voltage regulator). The voltage regular (not shown in FIG. 1A) can be an off-die (e.g., off-chip) voltage regulator located outside IC 102 or on-die (e.g., on-chip) voltage regulator located on IC 102.

In FIG. 1A, power supply nodes 121, 122, and 123 can be parts of other supply power rails (e.g., gated $VCC_1$, $VCC_2$, and $VCC_3$ power rails) of IC 102 to provide respective voltages $VCC_1$, $VCC_2$, and $VCC_3$ to functional units 111, 112, and 113, respectively. The value of voltages $VCC_1$, $VCC_2$, and $VCC_3$ is based on (e.g., equal to) the value of voltage $VCC_{IN}$. The values of voltages $VCC_1$, $VCC_2$, and $VCC_3$ can be the same or different.

Power switching circuitry 131, 132, and 133 can share voltage $VCC_{IN}$ but they can operate independently from each other to control (e.g., separately control) delivery of power from power supply node 105 to power supply nodes 121, 122, and 123 (where voltages $VCC_1$, $VCC_2$, and $VCC_3$ are respectively provided). Power switching circuitry 131, 132, and 133 can generate (e.g., provide) information (e.g., digital codes) $CODE_1$, $CODE_2$, and $CODE_3$, respectively. Each of information $CODE_1$, $CODE_2$, and $CODE_3$ can include digital information (e.g., a code including bits). Information $CODE_1$, $CODE_2$, and $CODE_3$ can have the same value or different values. Each of power switching circuitry 131, 132, and 133 can include transistors (not shown in FIG. 1A) coupled between power supply nodes 105 and a respective power supply node among power supply nodes 121, 122, and 123. Power switching circuitry 131, 132, and 133 can use respective information $CODE_1$, $CODE_2$, and $CODE_3$ to control delivery of power from power supply node 105 to nodes 121, 122, and 123, respectively.

Information $CODE_1$, $CODE_2$, and $CODE_3$ can be provided to IC 102 (e.g., by programming) during the manufacture of IC 102 before IC 102 is included in an IC package or in an electronic device or system (e.g., apparatus 100), or before IC 102 is shipped to a user (e.g., customer). In another example, information CODE can be provided to IC 102 after manufacturing (post-manufacturing) of IC 102 (e.g. after IC 102 is included in an IC package or in an electronic device or system (e.g., apparatus 100) or after IC 102 is shipped to a user (e.g., customer)).

As shown in FIG. 1A, IC 102 can include lines (conductive lines) 104, which can be conductive nodes within IC 102 or pins (or solder balls) on a package where IC 102 is located. Other devices external to IC 102 can communicate with IC 102 through lines 104. Information $CODE_1$, $CODE_2$, and $CODE_3$ can be provided to IC 102 through lines 104 (e.g., by programming or by other techniques). IC 102 may store (e.g., store in internal memory of IC 102) the values of information $CODE_1$, $CODE_2$, and $CODE_3$. During their operations, power switching circuitry 131, 132, and 133 can generate (e.g., regenerate) information $CODE_1$, $CODE_2$, and $CODE_3$ having values based on (e.g., equal to) the stored values.

Each of functional units 111, 112, and 113 can have different operational states (e.g., power states) that may include a higher power consumption state (e.g., active state) and a lower power consumption state (e.g., an inactive state). In the higher power consumption state, the functional unit (e.g., 111, 112, or 113) may actively perform its operations (e.g., processing information, decoding instructions, storing information (e.g., data) in memory cells, retrieving information from memory cells, or other operations). In a lower power consumption state, the functional unit (e.g., 111, 112, or 113) may be inactive or may be idling. Power consumed by the functional unit in a higher power consumption state is higher than power consumed by the functional unit in a lower power consumption state.

Functional units 111, 112, and 113 may not be in the same state at a particular time interval during an operation of IC 102. Thus, in order to avoid leakage of power, power supply node 105 can be disconnected from power supply node 121, 122, or 123 coupled to a particular functional unit (e.g., 111, 112, or 113) when that particular functional unit enters (or is in) the lower power consumption state. For example, when functional unit 111 enters a lower power consumption state, power switching circuitry 131 can disconnect power supply node 121 from power supply node 105 to avoid leakage of power. Power switching circuitry 131 can connect power supply node 121 to power supply node 105 (e.g., during a power-on mode) when functional unit 111 exits the lower power consumption state (e.g., changes from the lower power consumption state to the higher power consumption state). Power switching circuitry 131 can use information $CODE_1$ during part of its operation (e.g., during a power-on mode) when it connects power supply node 121 to power supply node 105.

Figure 1B:
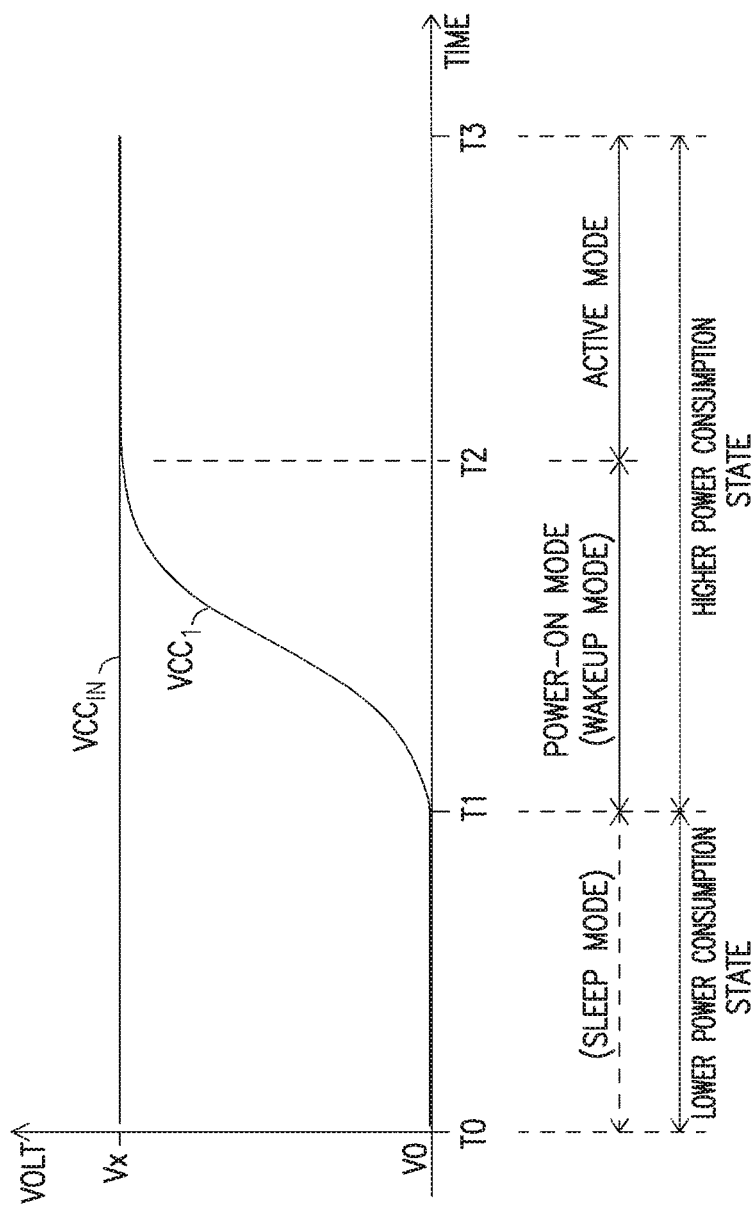
FIG. 1B is a timing diagram showing example waveforms of some of the voltages of the IC of FIG. 1A during different states of a functional unit of the IC, according to some embodiments described herein.

FIG. 1B is a timing diagram showing example waveforms of voltages $VCC_{IN}$ and $VCC_1$ of FIG. 1A during different states of functional unit 111 of IC 102, according to some embodiments described herein. FIG. 1B shows example waveform of voltage $VCC_1$. However, waveforms of voltages $VCC_2$ and $VCC_3$ during lower and higher power consumption states of each of functional units 112 and 113 can be similar to the waveform of voltage $VCC_1$ of FIG. 1B.

The following description refers to FIG. 1A and FIG. 1B. As shown in FIG. 1B, voltage $VCC_{IN}$ can have a value (e.g., value Vx) that is relatively unchanged (e.g., constant) between times T0 and T3. Voltage $VCC_1$ can have different values (e.g., values V0 (e.g., 0 volts) and Vx) depending on the states of functional unit 111 (FIG. 1A). As shown in FIG. 1B, the lower power consumption state of functional unit 111 can occur between times T0 and T1, and the higher power consumption state of functional unit 111 can occur between times T1 and T3. The lower power consumption state can include a sleep mode. The sleep mode can be part of the lower power consumption state or can be the entire lower power consumption state. Between times T0 and T1, functional unit 111 can be inactive (e.g., consume relatively low power (e.g., approximately 0 watts or close to 0 watts)). The higher power consumption state can include power-on mode (e.g., wakeup mode) between times T1 and T2, and an active mode between times T2 and T3.

Between times T0 and T1 (e.g., sleep mode), voltage $VCC_1$ can have a value V0 (e.g., 0 volts). This means that power supply node 121 may be disconnected from power supply node 105 by power switching circuitry 131 to avoid leakage of power. At time T1, functional unit 111 exits the lower power consumption state (e.g., exit the sleep mode) and enters the higher power consumption state (e.g., enters a power-on (or wakeup) mode). In response to functional unit 111 entering the higher power consumption state at time T1, power switching circuitry 131 can operate to connect power supply node 121 (FIG. 1A) to power supply node 105. As shown in FIG. 1B, as a result of power switching circuitry 131 connecting power supply node 121 to power supply node 105, the value of voltage $VCC_1$ can gradually change (increase) from value V0 and reach value Vx (e.g., the value of voltage $VCC_{IN}$) at time T2.

Between times T2 and T3 (e.g., active mode), power switching circuitry 131 can operate to keep the value of voltage $VCC_1$ equal to (e.g., substantially equal to) the value of voltage $VCC_{IN}$. Functional unit 111 may actively perform a function (e.g., perform at least one of sending data, receiving data, storing data in memory cells, reading data from memory cells, performing math operations, or other functions) between times T2 and T3.

Each of power switching circuitry 131, 132, and 133 of FIG. 1A can include any of the power switching circuitry described below with reference to FIG. 2A through FIG. 6.

Figure 2A:
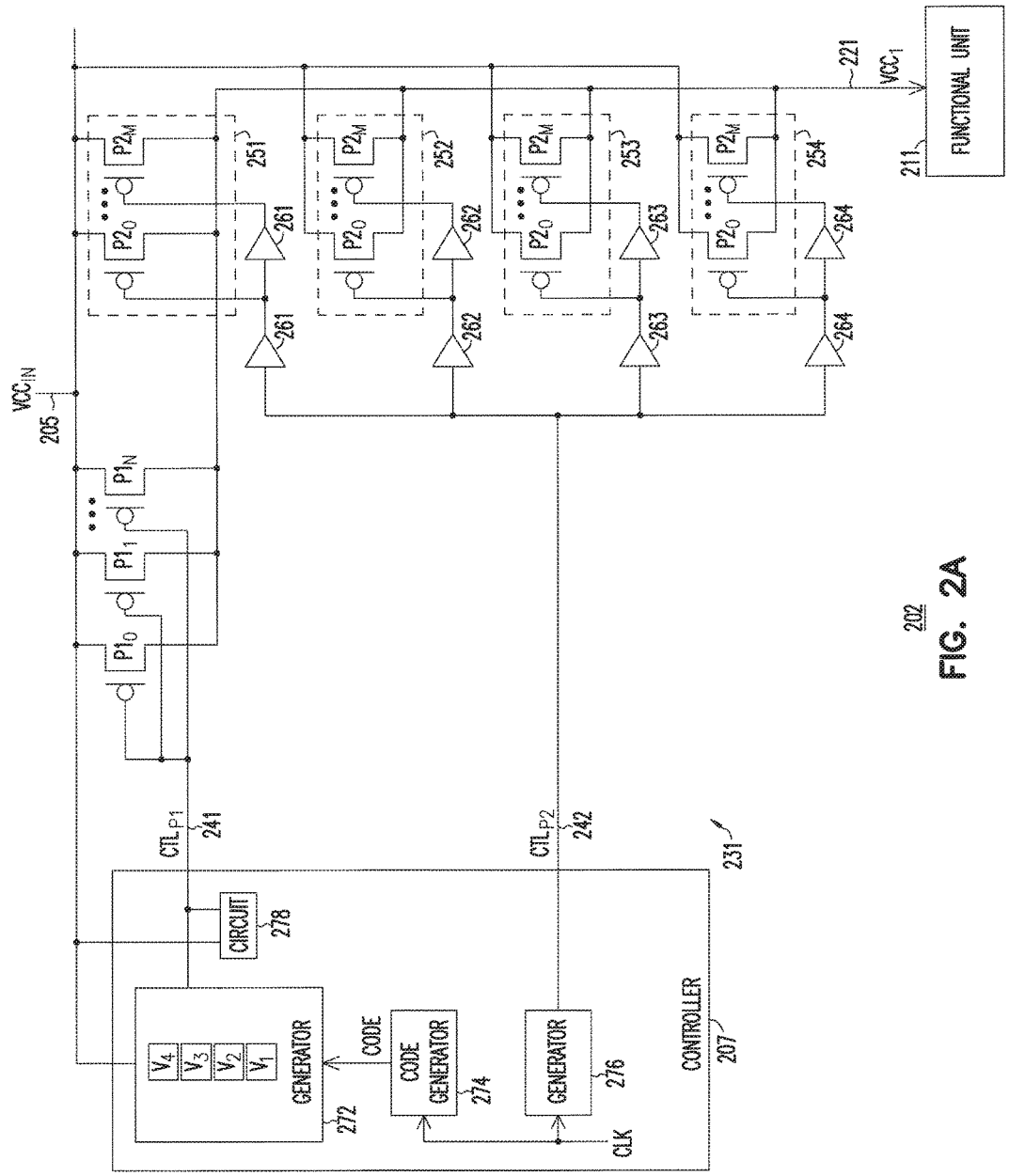
FIG. 2A shows a schematic diagram of an IC including power switching circuitry that includes transistors coupled in parallel between power supply nodes, according to some embodiments described herein.

FIG. 2A shows a schematic diagram of an IC 202 including power switching circuitry 231, which can include transistors coupled in parallel between power supply nodes 205 and 221, according to some embodiments described herein. IC 202 can correspond to IC 102 of FIG. 1A. Power switching circuitry 231 of IC 202 can correspond to any of power switching circuitry 131, 132, and 132 of FIG. 1A. FIG. 2A omits other components of IC 202 in order to not obscure the embodiments described herein.

As shown in FIG. 2A, IC 202 can include power supply nodes 205 and 221. Node 205 can receive voltage $VCC_{IN}$ (e.g., a voltage from a voltage regulator (not shown in FIG. 2A)). Power supply node 221 can provide a voltage $VCC_1$, which can be used as a power supply voltage for functional unit 211 of IC 202.

Power switching circuitry 231 can include transistors (e.g., first stage transistors) $P1_0$, and $P1_1$ through $P1_N$ coupled in parallel between power supply nodes 205 and 221, and transistors (e.g., second stage transistors) $P2_0$ through $P2_M$ coupled in parallel between power supply nodes 205 and 221. The number of transistors $P1_0$, and $P1_1$ through $P1_N$ can be different from the number of transistors $P2_0$ through $P2_M$ (e.g., the value of index N can be different from the value of index M). FIG. 2A shows an example where each of transistors $P1_0$, and $P1_1$ through $P1_N$ and $P2_0$ through $P2_M$ is a p-channel metal-oxide semiconductor (PMOS) transistor. Other types of transistors can be used.

Power switching circuitry 231 can include a controller 207 that can include nodes (e.g., output nodes) 241 and 242 to provide signals (e.g., control signals) $CTL_{P1}$ and $CTL_{P2}$, respectively. Each of signals $CTL_{P1}$ and $CTL_{P2}$ can be provided with different voltages at different times. Based on a state (e.g., lower or higher power consumption state) of functional unit 211, controller 207 can use the voltages provided to signal $CTL_{P1}$ to control the switching of (e.g., to turn on or turn off) transistors $P1_0$, and $P1_1$ through $P1_N$, and the voltages provided to signal $CTL_{P2}$ to control the switching of (e.g., to turn on or turn off) $P2_0$ through $P2_M$.

During a lower power consumption state (e.g., a sleep mode) of functional unit 211, controller 207 can use signals $CTL_{P1}$ to turn off transistors $P1_0$, and $P1_1$ through $P1_N$, and signal $CTL_{P2}$ to turn off transistors and $P2_0$ through $P2_M$ in order avoid leakage of power. Controller 207 can use signals $CTL_{P1}$ to turn on transistors $P1_0$, and $P1_1$ through $P1_N$, and signal $CTL_{P2}$ to turn on transistors and $P2_0$ through $P2_M$ when functional unit 211 exits the lower power consumption state (e.g., exits the sleep mode) and enters a higher power consumption state. As described in more detail below, controller 207 can cause signal $CTL_{P1}$ to have a ramped voltage during a power-on (e.g., wakeup) mode of the higher power consumption state in order to gradually turn on transistors $P1_0$, and $P1_1$ through $P1_N$. After transistors $P1_0$, and $P1_1$ through $P1_N$ are turned on (e.g., fully turned on), controller 207 can activate (e.g., cause a change in the voltage of) signal $CTL_{P2}$ to turn on transistors and $P2_0$ through $P2_M$.

As shown in FIG. 2A, transistors $P1_0$, and $P1_1$ through $P1_N$ can be controlled by the same signal (e.g., signal $CTL_{P1}$) at node 241. Controller 207 can use signal $CTL_{P1}$ to concurrent (e.g., simultaneously) turn on transistors $P1_0$, and $P1_1$ through $P1_N$. Transistors $P2_0$ through $P2_M$ can be controlled by the same signal (e.g., signal $CTL_{P2}$) at node 242. However, transistors $P2_0$ through $P2_M$ can be grouped in parallel transistor groups 251, 252, 253, and 254, such that transistors $P2_0$ through $P2_M$ between different transistor groups can be concurrently turned on, but transistors $P2_0$ through $P2_M$ within the same transistor group can be turned on in a sequential fashion (e.g., delayed fashion). Four transistor groups 251, 252, 253, and 254 are shown in FIG. 2A as an example. However, the number of transistor groups can vary.

As shown in FIG. 2A, power switching circuitry 231 can include buffers (e.g., drivers) 261 coupled in series with node 242, buffers (e.g., drivers) 262 coupled in series with node 242, buffers (e.g., drivers) 263 coupled in series with node 242, and buffers (e.g., drivers) 264 coupled in series with node 242. Buffers 261, 262, 263, and 264 can be coupled to node 242 in a parallel fashion as shown in FIG. 2A. Each of buffers 261, 262, 263, and 264 can include an output node coupled to a gate of a transistor among transistors $P2_0$ through $P2_M$ of a respective transistor group 251, 252, 253, or 254. For example, each of buffers 261 can include an output node coupled to a gate of one of transistors $P2_0$ through $P2_M$ of a respective transistor group 251. In another example, each of buffers 262 can include an output node coupled to a gate of one of transistors $P2_0$ through $P2_M$ of a respective transistor group 252.

Each of buffers 261, 262, 263, and 264 can include a complementary metal-oxide semiconductor (CMOS) buffer (e.g., CMOS driver) that can propagate a signal. Buffers 261, 262, 263, and 264 can form parallel circuit paths (e.g., separate circuit paths) from node 242 to transistor groups 251, 252, 253, and 254. The parallel circuit paths formed by buffers 261, 262, 263, and 264 can propagate signal $CTL_{P2}$ in a parallel fashion from node 242 to gates of transistors $P2_0$ through $P2_M$ of transistor groups 251, 252, 253, and 254.

As shown in FIG. 2A, buffers 261 can form a circuit path to propagate signal $CTL_{P2}$ from the node 242 to the gates of transistors $P2_0$ through $P2_M$ of transistor groups 251. Buffers 262 can form a circuit path to propagate signal $CTL_{P2}$ from the node 242 to the gates of transistors $P2_0$ through $P2_M$ of transistor groups 252. Similarly buffers 263 and 264 can form separate circuit paths to propagate signal $CTL_{P2}$ from the node 242 to the gates of transistors $P2_0$ through $P2_M$ of transistor groups 253 and 254, respectively. Thus, the connection of buffers 261, 262, 263, and 264 and transistor groups 251, 252, 253, and 254 as shown in FIG. 2A can form parallel chains (e.g., parallel daisy chains).

Controller 207 can include a generator 272, a code generator 274, a generator 276, and a circuit 278. Generator 272 can include a ramped voltage generator that can generate different voltages, such as voltages $V_1$, $V_2$, $V_3$, and $V_4$, having different values. Code generator 274 can generate information CODE (which is digital information). Generator 276 can generate signal $CTL_{P2}$ and provide it to node 242. Circuit 278 can operate to allow controller 207 to further control the value of signal $CTL_{P1}$ at node 241 during different modes (e.g., sleep mode and active mode) of functional unit 211. Controller 207 can include a node (e.g., a clock node) to receive a clock signal CLK (e.g., a periodical signal).

Code generator 274 can generate information CODE that can have different values (e.g., different bit values) based on timing (e.g., based on the number of periods) of signal CLK. Controller 207 can use information CODE to cause generator 272 to provide signal $CTL_{P1}$ with voltages $V_1$, $V_2$, $V_3$, and $V_4$ at different time intervals, such that the slope of signal $CTL_{P1}$ is a ramped signal having decreasing voltage values. This allows controller 207 to gradually turn on transistors $P1_0$, and $P1_1$ through $P1_N$ (which have their gates coupled to node 241 which carries signal $CTL_{P1}$). Generator 276 can generate signal $CTL_{P2}$ that can have different values (e.g., different voltages) based on timing (e.g., based on the number of periods) of signal CLK.

Figure 2B:
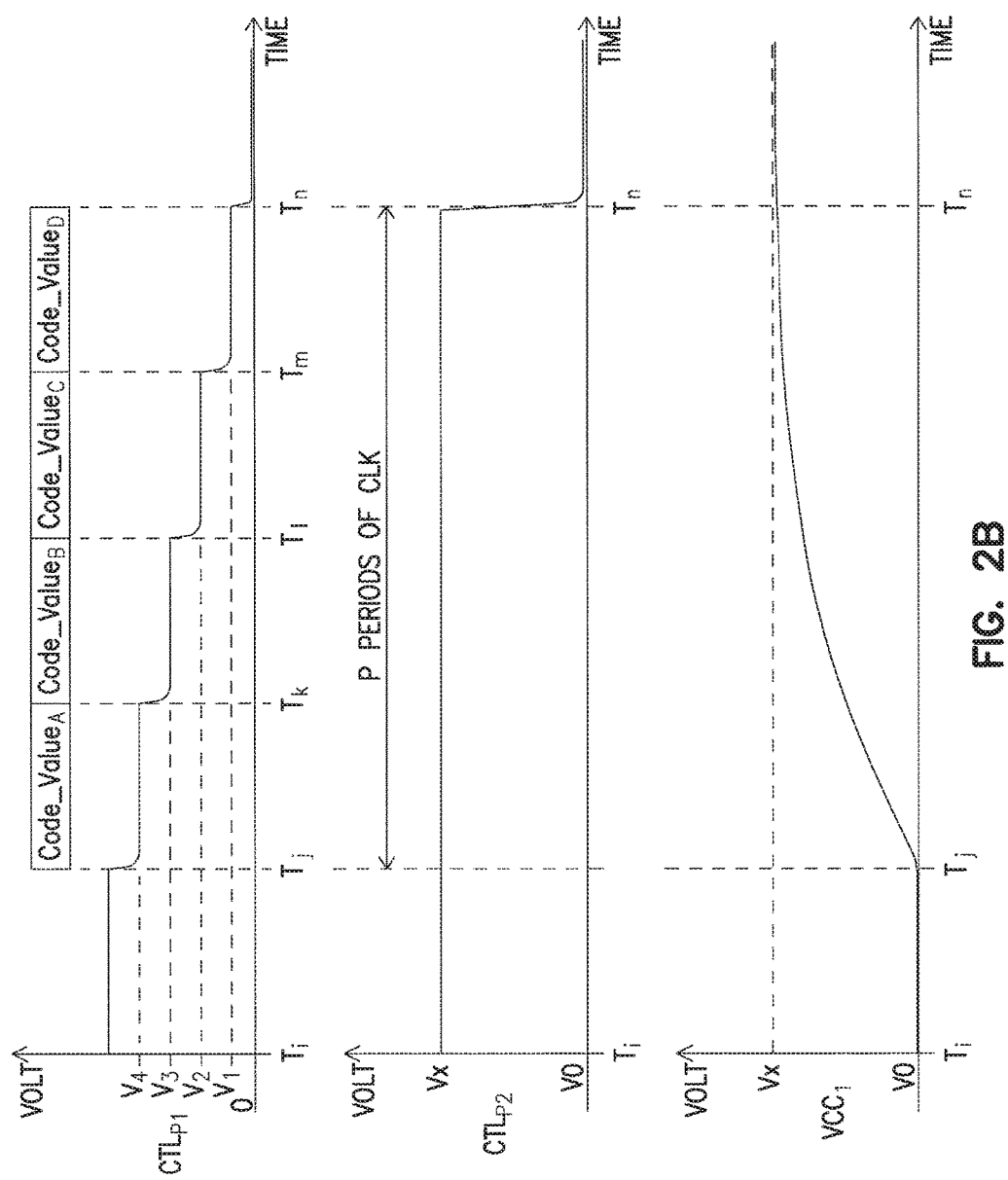
FIG. 2B shows timing diagrams showing waveforms of some signals of the power switching circuitry of FIG. 2A, according to some embodiments described herein.

FIG. 2B are timing diagrams showing waveforms of signals $CTL_{P1}$ $CTL_{P2}$, and voltage $VCC_1$ of FIG. 2A, according to some embodiments described herein. In FIG. 2B, a time interval between times $T_i$ and $T_j$ can occur during a lower power consumption state (e.g., during a sleep mode) of functional unit 211 (FIG. 2A). A time interval between times $T_j$ and $T_n$ can occur during a higher power consumption state (e.g., during a power-on state) of functional unit 211.

In FIG. 2B, Code_Value$_A$, Code_Value$_B$, Code_Value$_C$, and Code_Value$_D$ are the values of information CODE (generated by code generator 274 of FIG. 2A) at times $T_j$, $T_k$, $T_l$, and $T_m$, respectively. Each of values Code_Value$_A$, Code_Value$_B$, Code_Value$_C$, and Code_Value$_D$ can have a value based on values of a number of bits. Values Code_Value$_A$, Code_Value$_B$, Code_Value$_C$, and Code_Value$_D$ are different values (e.g., different digital values).

A shown in FIG. 2B, signal CTL$_{P1}$ is a continuous signal having voltage values in a decreasing direction. The waveform of signal CTL$_{P1}$ is based on values Code_Value$_A$, Code_Value$_B$, Code_Value$_C$, and Code_Value$_D$ of information CODE. Generator 272 (FIG. 2A) can use values Code_Value$_A$, Code_Value$_B$, Code_Value$_C$, and Code_Value$_D$ of information CODE to provide voltages $V_4$, $V_3$, $V_2$, and $V_1$, respectively, at different time intervals.

As shown in FIG. 2B, signal CTL$_{P2}$ can remain relatively unchanged at value Vx between times $T_i$ and $T_n$. At time $T_n$ signal CTL$_{P2}$ can be changed from one level (e.g., level at voltage Vx) to another level (e.g., level at voltage V0 (e.g., zero volts)). The interval between times $T_i$ and $T_n$ can be measured based on the periods (cycles) of clock signal CLK. For example, as shown in FIG. 2B, the time interval between times $T_j$ and $T_n$ can be measured by a number of periods (cycles) of clock signal CLK (e.g., P periods, where P is an integer). Controller 207 can cause signal CTL$_{P2}$ to change from one level to another level after P periods of clock signal CLK have lapsed from a reference time (e.g., time $T_j$). The value of P can be based on a time interval from time $T_j$ to a time (e.g., time $T_n$) at which transistors P1$_0$, and P1$_1$ through P1$_N$ are fully turned on, or alternatively a time at which voltage VCC$_1$ reaches a value close to the value of voltage VCC$_{IN}$ (e.g., approximately 95% of the value of VCC$_{IN}$). FIG. 2B shows an example where controller 207 can cause signal CTL$_{P2}$ to change from one level to another level at time $T_n$. However, controller 207 can cause signal CTL$_{P2}$ to change from one level to another level at another time (e.g., a time between times $T_m$ and $T_n$) at which transistors P1$_0$, and P1$_1$ through P1$_N$ are fully turned on (or alternatively, a time at which voltage VCC$_1$ reaches a value close to (e.g., 95% of) the value of voltage VCC$_{IN}$).

As shown in FIG. 2B, voltage VCC$_1$ can gradually increase from value V0 to value Vx (e.g., the value of voltage VCC$_{IN}$) while signal CTL$_{P1}$ decreases from a level at voltage V4 to voltage V1. The decreasing voltages provided to signal CTL$_{P1}$ allows controller 207 to provide different voltages to gates of transistors P1$_0$, and P1$_1$ through P1$_N$ to concurrently turn on transistors P1$_0$, and P1$_1$ through P1$_N$ in a gradual fashion.

FIG. 2A shows an example where transistors P1$_0$, and P1$_1$ through P1$_N$ are located at the same location (e.g., located adjacent to each other) in power switching circuitry 231. However, transistors P1$_0$, and P1$_1$ through P1$_N$ can be distributed at different locations in power switching circuitry 231. For example, one group of transistors P1$_0$, and P1$_1$ through P1$_N$ can be located at one location (e.g., a first location) in power switching circuitry 231, and another group of transistors P1$_0$, and P1$_1$ through P1$_N$ can be located at another location (e.g., a location not adjacent to the first location). The distributed groups of transistors P1$_0$, and P1$_1$ through P1$_N$ can be controlled by the same signal (e.g., signal CTL$_{P1}$) generated by the same generator (e.g., generator 272). Alternatively, the distributed groups of transistors P1$_0$, and P1$_1$ through P1$_N$ can be controlled by different signals (e.g., similar to signal CTL$_{P1}$) generated by different generators (e.g., similar to generator 272). Distributing transistors P1$_0$, and P1$_1$ through P1$_N$ in different groups at different locations (non-adjacent locations) may reduce electro-migration in metal structures that are used to deliver the current (e.g., rush current) to power supply node 221 during a power-on (e.g., wakeup mode).

FIG. 2A shows an example where transistor groups 251, 252, 253, and 254 can be controlled by signal CTL$_{P2}$, such that transistors P2$_0$ through P2$_M$ among transistor groups 251, 252, 253, and 254, can be turned on at the same time (e.g., transistors P2$_0$ through P2$_M$ of transistor group 251 are turned at the same time as transistors P2$_0$ through P2$_M$ of each of the other transistor groups 252, 253, and 254 are turned on). However, in an alternative structure of power switching circuitry 231, transistors P2$_0$ through P2$_M$ of fewer than all of transistor groups 251, 252, 253, and 254 (e.g., transistors P2$_0$ through P2$_M$ of only some of transistor groups 251, 252, 253, and 254) can be turned on when (e.g., after) transistors P1$_0$, and P1$_1$ through P1$_N$ are fully turned on. For example, in such an alternative structure, transistors P2$_0$ through P2$_M$ of transistor groups 251 and 252 can be turned on (while transistors P2$_0$ through P2$_M$ of transistor groups 253 and 254 are not turned on) when transistors P1$_0$, and P1$_1$ through P1$_N$ are fully turned on. Then, transistors P2$_0$ through P2$_M$ of transistor groups 253 and 254 can be turned on after transistors P2$_0$ through P2$_M$ of transistor groups 251 and 252 are turned on.

The structure of power switching circuitry 231 (where transistors P2$_0$ through P2$_M$ among transistor groups 251, 252, 253, and 254 can be turned on at the same time) can provide a relatively shorter time for the value of voltage VCC$_1$ to reach the value of voltage VCC$_{IN}$. However, supply voltage noise at power supply node 205 may occur. The described alternative structure of power switching circuitry 231 (where transistors P2$_0$ through P2$_M$ in fewer than all of transistor groups 251, 252, 253, and 254 can be turned on at the same time) can suppress supply voltage noise at power supply node 205. However, this may result in a relatively longer time for the value of voltage VCC$_1$ to reach the value of voltage VCC$_{IN}$. Thus, transistors P2$_0$ through P2$_M$ of either fewer than all of transistor groups 251, 252, 253, and 254, or all of transistor groups 251, 252, 253, and 254, can be turned on after transistors P1$_0$, and P1$_1$ through P1$_N$ are fully turned on. However, a tradeoff can be made between supply voltage noise and the amount of time at which the value of voltage VCC$_1$ can reach the value of voltage VCC$_{IN}$. An example of such a tradeoff (e.g., an optimum tradeoff) may involve selecting a number of transistor groups 251, 252, 253, and 254 to be turned on (after transistors P1$_0$, and P1$_1$ through P1$_N$ are fully turned on) such that supply voltage noise from such a selected number of transistor groups results in an equal supply voltage noise that may occur when transistors P1$_0$, and P1$_1$ through P1$_N$ are turned on.

Thus, as described above with reference to FIG. 2A and FIG. 2B, operations of power switching circuitry 231 can include two phases: a gradual turning on of transistors P1$_0$, and P1$_1$ through P1$_N$ and then a turning on of transistors P2$_0$ through P2$_M$. The number of transistors P1$_0$, and P1$_1$ through P1$_N$ can be relatively small (e.g., N can be about at least ten times less than M). Since the number of transistors P1$_0$, and P1$_1$ through P1$_N$ is relatively small and since transistors P1$_0$, and P1$_1$ through P1$_N$ are gradually turned on, the amount of current to flow between power supply nodes 205 and 221 (when transistors $P1_0$, and $P1_1$ through $P1_N$ are turned on) may not affect (e.g., cause excessive heat on) the structure (e.g., Fin Field Effect Transistor (FinFET) structure) of transistors $P1_0$, and $P1_1$ through $P1_N$, thereby preventing damage to transistors $P1_0$, and $P1_1$ through $P1_N$ (e.g., damage caused by excessive heat).

Figure 3:
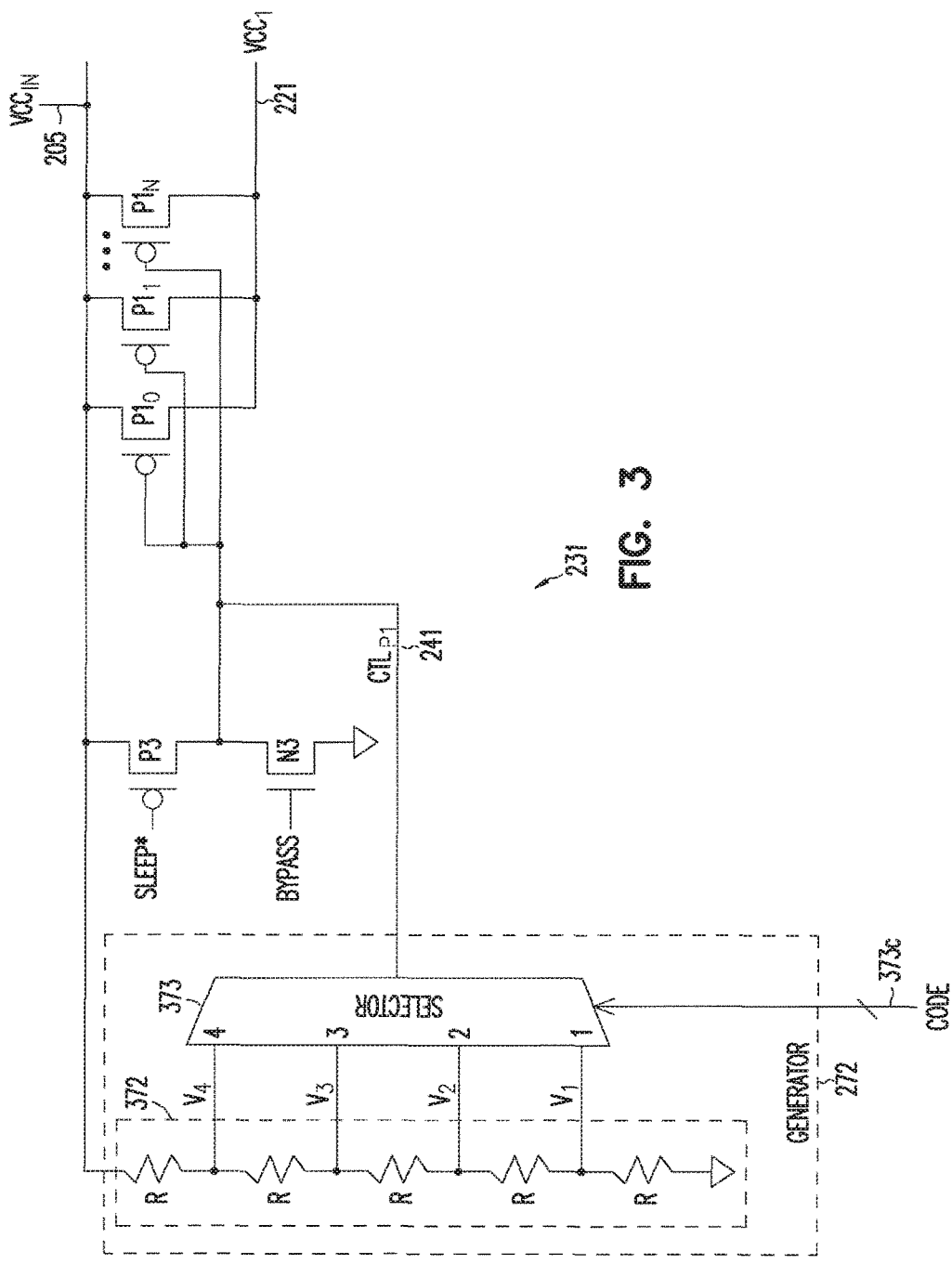
FIG. 3 shows a schematic diagram of a portion of the power switching circuitry of FIG. 2A including a resistive network and a selector, according to some embodiments described herein.
Figure 4:
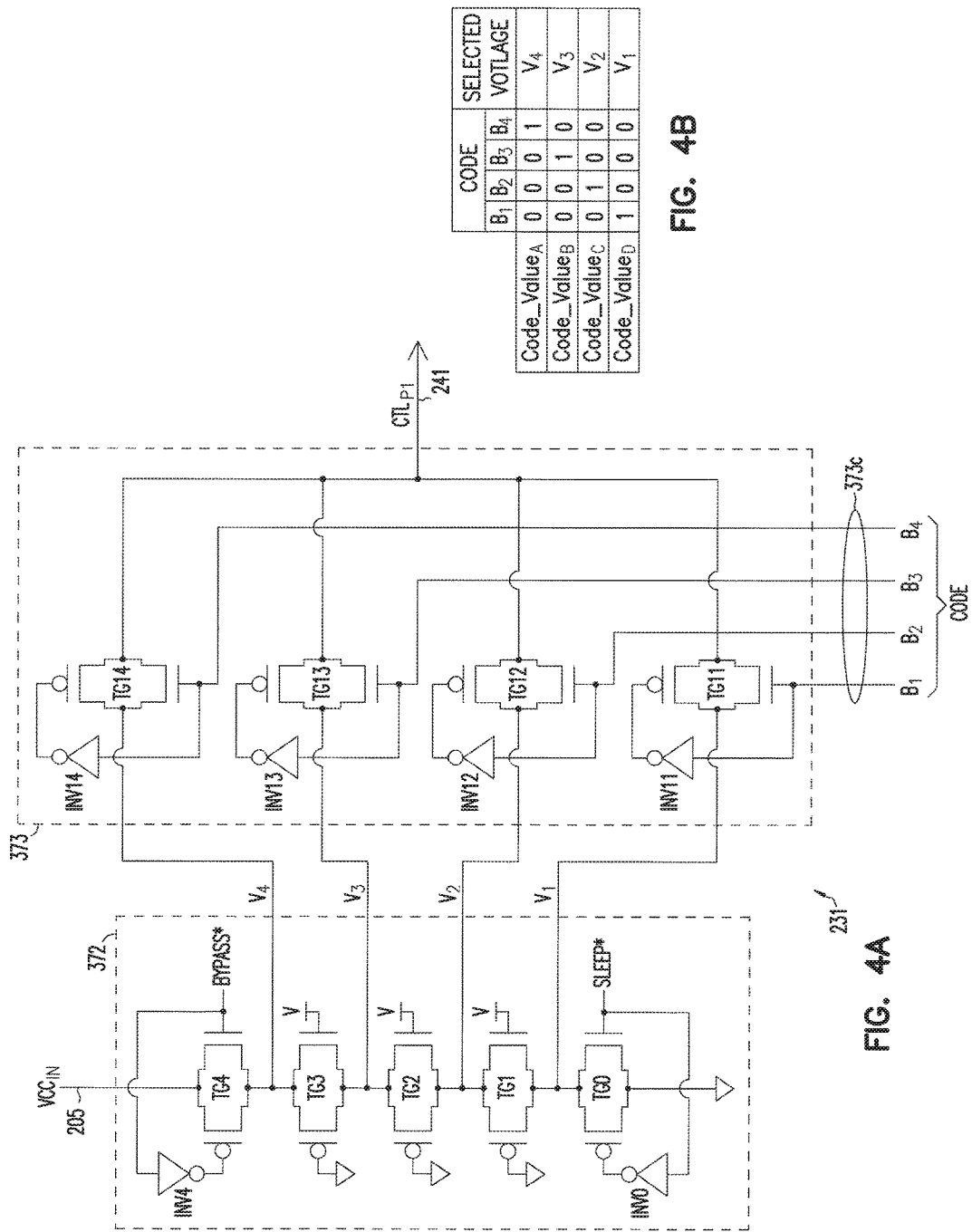
FIG. 4A shows a schematic diagram of the resistive network and the selector of FIG. 3 including transmission gates, according to some embodiments described herein.
FIG. 4B is a chart showing relationships between the values of digital information provided to the selector of FIG. 4A and corresponding values of voltages provided to gates of the transistors of the power switching circuitry of FIG. 2A, according to some embodiments described herein.

FIG. 3 shows a schematic diagram of a portion of power switching circuitry 231 of FIG. 2A including a resistive network 372, and a selector 373, according to some embodiments described herein. Resistive network 372 and selector 373 can be part of generator 272 of FIG. 2A. Alternatively, selector 373 can be part of another component of power switching circuitry 231 of FIG. 2A.

As shown in FIG. 3, resistive network 372 can include resistors R coupled in series between power supply node 205 and ground (e.g., a ground node). The value of resistors R can be the same. For example, resistors R can have the same unit resistor value. Resistors R of resistive network 372 can form a resistor ladder (R-ladder) voltage divider that can generate voltages $V_1$, $V_2$, $V_3$, and $V_4$ having different values between ground and the value of voltage $VCC_{IN}$.

The values of voltages $V_4$, $V_3$, $V_2$, and $V_1$ can be decreased in a sequential order. For example, the value of voltage $V_4$ is greater than the value of voltage $V_3$; the value of voltage $V_3$ is greater than the value of voltage $V_2$; and the value of voltage $V_2$ is greater than the value of voltage $V_1$. The value of voltage $V_1$ can be greater than zero.

As described above, resistors R can have the same unit resistor value. Thus, global PVT variations affect the unit resistors in the R-ladder equally. This means that the R-ladder voltage divider of resistive network 372 can be insensitive to global PVT. Therefore, a relatively constant ramped voltage at node 241 (which is based on voltages $V_4$, $V_3$, $V_2$, and $V_1$) may be achieved. A constant ramped voltage helps improve the gradual turning on of transistors $P1_0$, and $P1_1$ through $P1_N$ during a power-on (e.g., wakeup) mode. This can lead to robust, well controlled wake current profiles (e.g., power-on mode current profiles) across PVT corners.

As shown in FIG. 3, selector (e.g., multiplexor) 373 can include input nodes (e.g., input nodes 1, 2, 3, and 4) coupled to respective nodes (e.g., voltage output nodes) of resistive network 372 that provide voltages $V_1$, $V_2$, $V_3$, and $V_4$, respectively. Selector 373 can include an output node coupled to node 241, and nodes (e.g., control nodes) 373c to receive information CODE. Nodes 373c can include separate nodes (e.g., separate lines) to receive (e.g., receive in parallel) respective bits of information CODE. Based on the value of information CODE, selector 373 can select voltages $V_1$, $V_2$, $V_3$, and $V_4$ (generated by resistive network 372) and provide the selected voltage to node 241. Selector 373 can select voltages $V_1$, $V_2$, $V_3$, and $V_4$ in a decreasing order from high to low (e.g., voltages $V_4$, $V_3$, $V_2$, and $V_1$), such that signal $CTL_{P1}$ can provide voltages from a higher value to a lower value (e.g., based on the values of voltages $V_4$, $V_3$, $V_2$, and $V_1$).

Thus, resistive network 372 and selector 373 can form a digital-to-analog converter (DAC) to provide analog voltages (e.g., voltages $V_1$, $V_2$, $V_3$, and $V_4$) to node 241 in the form of signal $CTL_{P1}$ based on the value (digital value) of information CODE. This means that the values of voltages (e.g., $V_1$, $V_2$, $V_3$, and $V_4$) provided to the gates of transistors $P1_0$, and $P1_1$ through $P1_N$ (which are coupled to node 241) are based on the values of information CODE. As an example, selector 373 can select voltage $V_4$ and provide it to node 241 if the value of information CODE is value Code_$Value_A$ (FIG. 2B); selector 373 can select voltage $V_3$ and provide it to node 241 if the value of information CODE is value Code_$Value_B$; selector 373 can select voltage $V_2$ and provide it to node 241 if the value of information CODE is value Code_$Value_C$ (FIG. 2B); and selector 373 can select voltage $V_1$ and provide it to node 241 if the value of information CODE is value Code_$Value_D$. The R-ladder-based voltage divider of resistive network 372 is used with selector 373 to form a resistive DAC (as shown in FIG. 3) as an example. Other DAC topology (e.g., switched-capacitor DAC and current-based DAC) can be used.

As shown in FIG. 3, power switching circuitry 231 may use signals SLEEP* and BYPASS to control transistors $P1_0$, and $P1_2$ through $P1_N$ (in addition to signal $CTL_{P1}$) depending on the states of functional unit 211 (FIG. 2A).

During a time interval (e.g., between times $T_i$ and $T_j$ in FIG. 2B) in a lower power consumption state (e.g., sleep mode), signal BYPASS can have a level (e.g., "low" or zero volts) to turn off transistor N3. This can disconnect node 241 from ground. During this time interval (e.g., between times $T_i$ and $T_j$ in FIG. 2B), signal SLEEP* can have a level (e.g., "low" or zero volts) to turn on transistor P3. This can connect node 241 to power supply node 205 (through transistor P3) to turn off transistors $P1_0$, and $P1_2$ through $P1_N$ in order to avoid leakage of power.

During a time interval (e.g., between times $T_j$ and $T_n$) of a higher consumption state (e.g., wakeup mode), signal SLEEP* can have a level (e.g., "high" or 1V for example) to turn off transistor P3. This can disconnect node 241 from power supply node 205 (FIG. 3). During this time interval (e.g., between times $T_i$ and $T_n$), signal BYPASS can have a level (e.g., "low" or zero volts) to keep transistor N3 turned off. During this time interval (e.g., between times $T_i$ and $T_n$), node 241 is provided with voltages $V_1$, $V_2$, $V_3$, and $V_4$ to gradually turn on transistors $P1_0$, and $P1_2$ through $P1_N$. After time $T_n$, signal $CTL_{P1}$ can be deactivated, such that selector 373 may not provide voltages to signal $CTL_{P1}$. However, after time $T_n$, signal BYPASS can have a level (e.g., "high") to turn on transistor N3. This can connect node 241 to ground in order to cause transistors $P1_0$, and $P1_2$ through $P1_N$ to fully turn on.

Thus, as described above, transistors $P1_0$, and $P1_2$ through $P1_N$ can be concurrently (e.g., simultaneously) and gradually turned on using the DAC technique that applies a ramped voltage (e.g., voltages $V_4$, $V_3$, $V_2$, and $V_1$) to the gates of transistors $P1_0$, and $P1_2$ through $P1_N$ based on digital values of information CODE. Not using this technique (e.g., by not gradually turning on transistors $P1_0$, and $P1_2$ through $P1_N$ or by applying a digital signal to the gates of transistors $P1_0$, and $P1_2$ through $P1_N$) may result in relatively high rush current peaks (e.g., high di/dt at power supply nodes 221 and 205), voltage droops of the waveform of voltage $VCC_{IN}$, and supply voltage noise in neighboring components (e.g., functional units) that share voltage $VCC_{IN}$ with power switching circuitry 231.

Using the described DAC technique to concurrently and gradually turn on transistors $P1_0$, and $P1_2$ through $P1_N$ can help avoid some drawbacks mentioned above, such as the relatively high rush current peaks, the voltage droops of the waveform of voltage $VCC_{IN}$, and the supply voltage noise in neighboring components. Further, as described above, concurrently and gradually turning on transistors $P1_0$, and $P1_2$ through $P1_N$ can also help avoid excessive heat on the structure (e.g., FinFET structure) of transistors $P1_0$, and $P1_2$ through $P1_N$, thereby preventing damage to transistors $P1_0$, and $P1_2$ through $P1_N$ (e.g., damage caused by avoid excessive heat).

Moreover, as described above, information CODE can be programmable post-manufacturing (e.g., post-silicon). This may avoid calibration (e.g., post-silicon trimming) of components associated with power switching circuitry 231 of IC 202.

Moreover, the described techniques can be scalable to different design sizes. For example, different functional units (e.g., functional units 111, 112, and 113) of the same IC may use different solutions for their respective power-on modes. With the technique described herein, power switching circuitry 231 (FIG. 2A through FIG. 3) can be individually structured and configured to operate in ways to fit operation of a particular functional unit during the power-on mode of that particular functional unit. Thus, in the same IC, different power switching circuitry can have different structures based on operations of respective functional units coupled to the different power switching circuitry. In another example, power switching circuitry 231 can be structured and configured to operate in ways based on different power domain sizes (e.g., different sizes of functional unit 211 in FIG. 2A or functional units 111, 112, 113 in FIG. 1A).

FIG. 4A shows a schematic diagram of resistive network 372 and selector 373 of FIG. 3A including transmission gates, according to some embodiments described herein. As shown in FIG. 4A, resistive network 372 can include transmission gates TG0 through TG4 coupled in series between power supply nodes 205 and ground. Each of transmission gates TG0 through TG4 can include two transistors (e.g., p-channel and n-channel transistors) coupled as shown in FIG. 4A. Voltages $V_1$, $V_2$, $V_3$, and $V_4$ can be generated at respective nodes at transmission gates TG0 through TG4. The gates of each of transmission gates TG1 through TG3 can be controlled by ground potential (e.g., zero volts) and a voltage V, such that transmission gates TG1 through TG3 can be normally turned on (e.g., turned on during operation of power switching circuitry 231 (FIG. 2A)).

Transmission gate TG0 can be coupled to an inverter INV0 and controlled by a signal SLEEP*. Transmission gate TG0 can be turned on when signal SLEEP* has one level (e.g., "high") and turned off on when signal SLEEP* has another level (e.g., "low").

Transmission gate TG4 can be coupled to an inverter INV4 and controlled by a signal BYPASS* (which can be a complement of signal BYPASS). Transmission gate TG4 can be turned on when signal BYPASS* has one level (e.g., "high") and turned off when signal BYPASS* has another level (e.g., "low").

During a time interval (e.g., between times $T_i$ and $T_j$ in FIG. 2B) in a lower power consumption state (e.g., sleep mode), signal SLEEP* can have a level (e.g., "low") to turn off transmission gate TG0. This can prevent static current from flowing (e.g., flowing between power supply nodes 205 and ground) in resistive network 372.

During a time interval (e.g., between times $T_j$ and $T_n$ in FIG. 2B) in a higher power consumption state (e.g., wakeup mode) and before transistors $P1_0$, and $P1_2$ through $P1_N$ are fully turned on (e.g., before signal $CTL_{P1}$ is provided with voltage $V_1$), each of signals SLEEP* and BYPASS can have a level to turn on respective transmission gates TG0 and TG4. This allows a current path to form between power supply nodes 205 and ground in order to generate voltages $V_1$, $V_2$, $V_3$, and $V_4$ in resistive network 372.

Selector 373 can include transmission gates TG11 through TG14 and inverters INV11 through INV14. The gates of transmission gates TG11 through TG14 can be respectively coupled to nodes 373c, which receive information CODE. Based on the value of information CODE, selector 373 can turn on one of transmission gates TG11 through TG14 while the other transmission gates among transmission gates TG11 through TG14 are turned off. Selector 373 can select voltages $V_1$, $V_2$, $V_3$, and $V_4$ (generated by resistive network 372) and provide the selected voltage to node 241 through one of transmission gates TG11 through TG14 that is turned on.

As shown in FIG. 4A, information CODE can include bits $B_1$, $B_2$, $B_3$, and $B_4$ that can be received in parallel at nodes 373c. The value (binary value) of the combination of bits $B_1$, $B_2$, $B_3$, and $B_4$ represents the value of one of values Code_Value$_A$, Code_Value$_B$, Code_Value$_C$, and Code_Value$_D$. Each value of the combination of bits $B_1$, $B_2$, $B_3$, and $B_4$ can cause selector 373 to select a different voltage among voltages $V_1$, $V_2$, $V_3$, and $V_4$ to be provided to node 241.

FIG. 4B is a chart showing the relationships among the values of information CODE and the voltages provided to node 241 in FIG. 4A, according to some embodiments described herein. As shown in FIG. 4B, values Code_Value$_A$, Code_Value$_B$, Code_Value$_C$, and Code_Value$_D$ can be "0001", "0010", "0100", and "1000", respectively. These values can be used to select respective voltages $V_4$, $V_3$, $V_2$, and $V_1$ (in a decreasing order), such that transistors $P1_0$, and $P1_2$ through $P1_N$ can be gradually turned on.

FIG. 4A shows resistive network 372 including transmission gates as an example. Other structures can be used. For example, n-well resistors may be used as resistors in resistive network 372. Using area-efficient transmission gates in resistive network 372 and selector 373 can save area in power switching circuitry 231 and can reduce costs associated with generating and providing voltages $V_1$, $V_2$, $V_3$, and $V_4$ to node 241.

Figure 5:
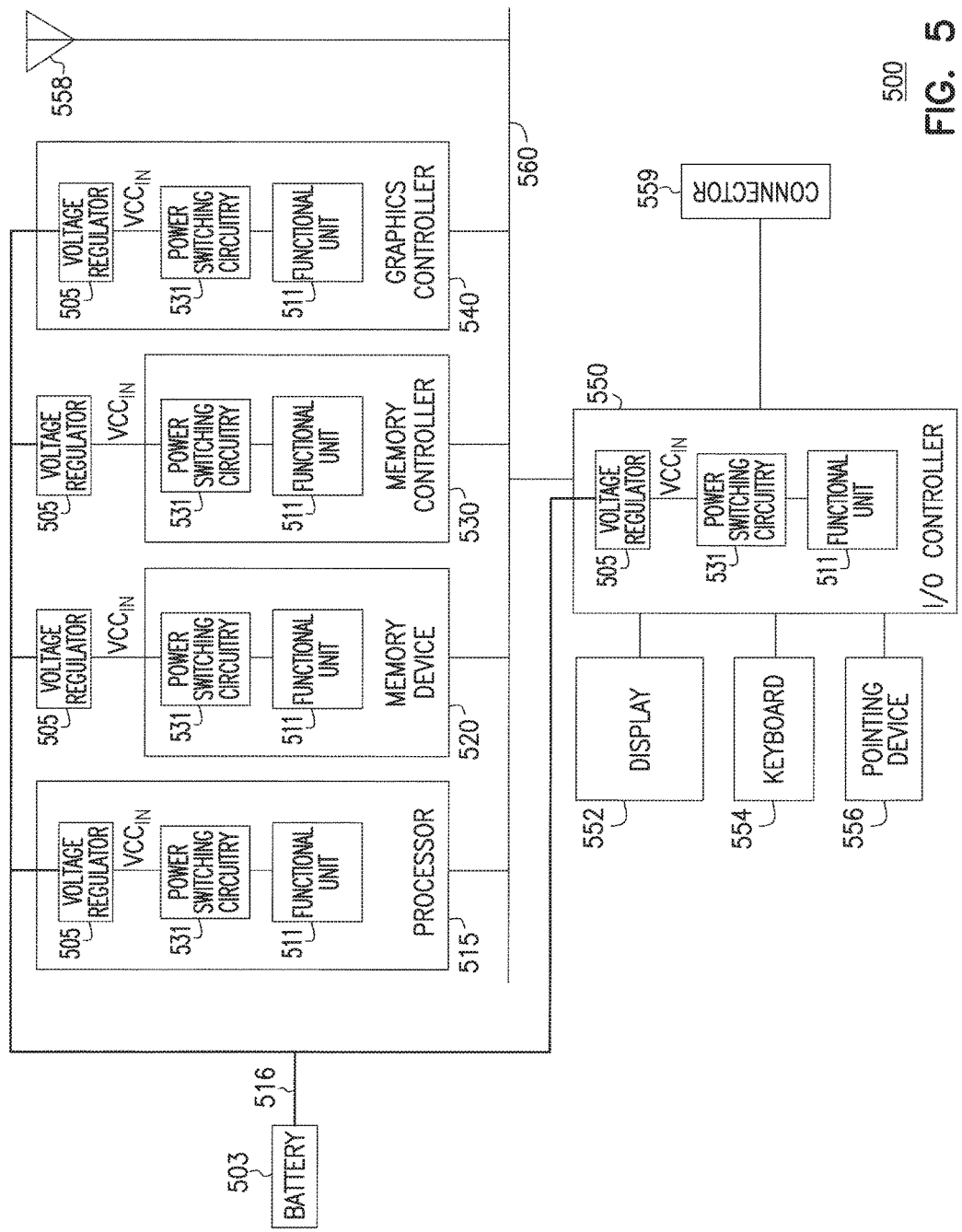
FIG. 5 shows an apparatus in the form of a system (e.g., electronic system), according to some embodiments described herein.

FIG. 5 shows an apparatus in the form of a system (e.g., electronic system) 500, according to some embodiments described herein. System 500 can include or be included in a computer, a tablet, or other electronic systems. As shown in FIG. 5, system 500 can include components such as a battery 503, a processor 515, a memory device 520, a memory controller 530, a graphics controller 540, an input and output (I/O) controller 550, a display 552, a keyboard 554, a pointing device 556, at least one antenna 558, a connector 559, and a bus 560. Bus 560 can include conductive lines (e.g., metal-based traces on a circuit board where the components of system 500 are located).

In some arrangements, system 500 does not have to include a display. Thus, display 552 can be omitted from system 500. In some arrangements, system 500 does not have to include any antenna. Thus, antenna 558 can be omitted from system 500.

Battery 503 can provide power to the components of system 500, e.g., through a power delivery path 516. Such components can include a processor 515, a memory device 520, a memory controller 530, a graphics controller 540, and input/output (I/O) controller 550.

Processor 515 can include a general-purpose processor or an application specific integrated circuit (ASIC). Processor 515 can include a CPU.

Memory device 520 can include a dynamic random access memory (DRAM) device, a static random access memory (SRAM) device, a flash memory device, a phase change memory device, a combination of these memory devices, or other types of memory. FIG. 5 shows an example where memory device 520 is a stand-alone memory device separated from processor 515. In an alternative arrangement, memory device 520 and processor 515 can be located on the same die. In such an alternative arrangement, memory device 520 is an embedded memory in processor 515, such as embedded DRAM (eDRAM), embedded SRAM (eSRAM), embedded flash memory, or another type of embedded memory.

Display 552 can include a liquid crystal display (LCD), a touchscreen (e.g., capacitive or resistive touchscreen), or another type of display. Pointing device 556 can include a mouse, a stylus, or another type of pointing device.

I/O controller 550 can include a communication module for wired or wireless communication (e.g., communication through one or more antennas 558). Such wireless communication may include communication in accordance with WiFi communication technique, Long Term Evolution Advanced (LTE$_A$) communication technique, or other communication techniques.

I/O controller 550 can also include a module to allow system 500 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 559 can be structured (e.g., can include terminals, such as pins) to allow system 500 to be coupled to an external device (or system). This may allow system 500 to communicate (e.g., exchange information) with such a device (or system) through connector 559.

Connector 559 and at least a portion of bus 560 can include conductive lines that conform with at least one of USB, DP, HDMI, Thunderbolt, PCIe, Ethernet, and other specifications.

As shown in FIG. 5, each of processor 515, memory device 520, memory controller 530, graphics controller 540, and I/O controller 550 can include a functional unit 511 and power switching circuitry 531. Functional unit 511 and power switching circuitry 531 can include any of the functional units and power switching circuitry described above with reference to FIG. 1A through FIG. 4B.

As shown in FIG. 5, system 500 can include voltage regulators 505, each of which can include an input node coupled to power delivery path 516 to provide voltage VCC$_{IN}$ (e.g., un-gated VCC$_{IN}$ voltage) based on power from battery 503. Some of the voltage regulators 505 can be on-die voltage regulator or off-die voltage regulators. For example, processor 515, graphics controller 540, and I/O controller 550 can include an on-die voltage regulator 505, and voltage regulators 505 providing voltages VCC$_{IN}$ to memory device 520 and memory controller 530 can be off-die voltage regulators 505.

FIG. 5 shows an example where each of processor 515, graphics controller 540, and I/O controller 550 includes an on-die voltage regulator 505. However, in some structures of system 500, some (or all) of processor 515, graphics controller 540, and I/O controller 550 may not include an on-die voltage regulator 505.

FIG. 5 shows the components of system 500 arranged separately from each other as an example. For example, each of processor 515, memory device 520, memory controller 530, graphics controller 540, and I/O controller 550 can be located on a separate IC (e.g., semiconductor die or an IC chip). In some arrangements, two or more components (e.g., processor 515, memory device 520, graphics controller 540, and I/O controller 550) of system 500 can be located on the same die (e.g., same IC chip) that forms a system-on-chip (SoC) or located on the same IC package that forms a system-on-package (SoP) or system-in-package (SiP).

Figure 6:
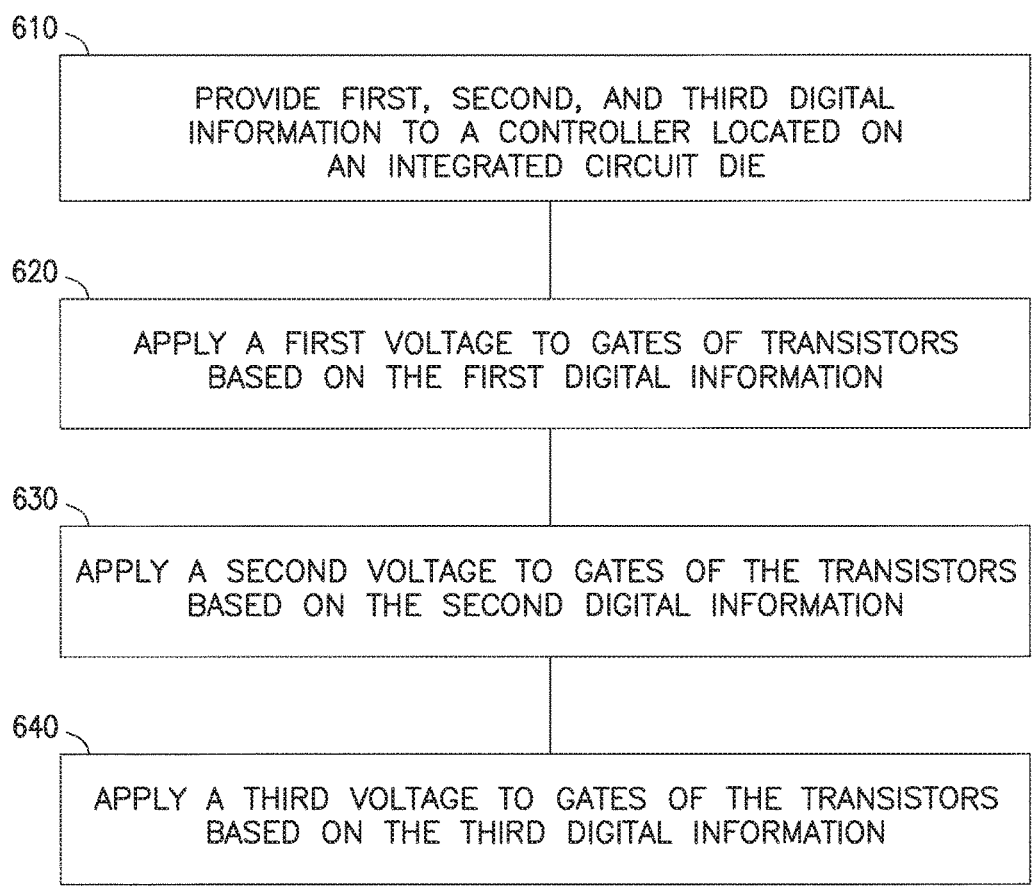
FIG. 6 is a flowchart showing a method of operating an apparatus, according to some embodiments described herein.

FIG. 6 is a flowchart showing a method 600 of operating an apparatus, according to some embodiments described herein. The apparatus used in method 600 can include any of the apparatuses (e.g., apparatus 100 and system 500 including power switching circuitry 131, 231, and 531) described above with reference to FIG. 1A through FIG. 5. Some of the activities in method 600 may be performed by hardware, software, firmware, or any combination of hardware, software, and firmware.

As shown in FIG. 6, activity 610 of method 600 can include providing first, second, and third digital information to a controller located on an IC die. The controller coupled to transistors can be located on the integrated circuit die. The transistors can be coupled in parallel between a first power supply node and a second power supply node. Activity 620 of method 600 can include applying a first voltage to gates of the transistors based on the first digital information. Activity 630 of method 600 can include applying a second voltage to gates of the transistors based on the second digital information. Activity 640 of method 600 can include applying a third voltage to gates of the transistors based on the third digital information.

Method 600 can include fewer or more activities relative to activities 610, 620, 630, and 640 shown in FIG. 6. For example, method 600 can include activities and operations of any of the apparatuses (e.g., apparatus 100 and system 500 including power switching circuitry 131, 231, and 531) described above with reference to FIG. 1A through FIG. 5.

The illustrations of the apparatuses (e.g., apparatus 100 and system 500 including power switching circuitry 131, 231, and 531) and methods (e.g., method 600 and operations of apparatus 100 and system 500 including operations of power switching circuitry 131, 231, and 531) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

ADDITIONAL NOTES AND EXAMPLES

Example 1 includes subject matter (such as a device, an electronic apparatus (e.g., circuit, electronic system, or both), or a machine) including a first power supply node, a second power supply node, transistors coupled in parallel between the first and second power supply nodes, and a controller to provide a first voltage, a second voltage, and a third voltage to gates of the transistors based on digital information, the first, second, and third voltages having different values based on values of the digital information.

In Example 2, the subject matter of Example 1 may optionally include, further comprising first additional transistors coupled in parallel between the first and second power supply nodes, and first buffers coupled in series with an output of the controller, each of the first buffers including an output node coupled to a gate of one of the first additional transistors.

In Example 3, the subject matter of Example 2 may optionally include, further comprising second additional transistors coupled in parallel between the first and second power supply nodes, and second buffers coupled in series with the output of the controller in parallel with the first buffers, each of the second buffers including an output node coupled to a gate of one of the second additional transistors.

In Example 4, the subject matter of any of Examples 1-3 may optionally include, wherein the controller includes a generator to generate the first, second, and third voltages, and a selector to receive the digital information and select the first, second, and third voltages provided to the gates of the transistors based on different values of the digital information.

In Example 5, the subject matter of any of Examples 1-3 may optionally include, wherein the controller includes a resistive network coupled to the first power supply node and a ground node, the resistive network including a first node to provide the first voltage, a second node to provide the second voltage, and a third node to provide the third voltage.

In Example 6, the subject matter of Example 5 may optionally include, wherein the controller includes a selector including input nodes coupled to respective first, second, and third nodes of the resistive network, an output node coupled to the gates of the transistors, and nodes to receive bits of the digital information.

In Example 7, the subject matter of Example 6 may optionally include, wherein the selector includes first, second, and third transmission gates coupled to the first, second, and third nodes, respectively, of the resistive network.

In Example 8, the subject matter of Example 1 may optionally include, wherein the second power supply node is coupled to a functional unit, and the controller is to provide the first, second, and third voltages to the gates of the transistors when the functional unit changes from a first power consumption state to a second power consumption state.

In Example 9, the subject matter of Example 8 may optionally include, wherein the transistors are to turn off during the first power consumption state and to turn on in the second power consumption state.

In Example 10, the subject matter of Example 8 may optionally include, wherein the first power consumption state includes a sleep mode of the functional unit.

Example 11 includes subject matter (such as a device, an electronic apparatus (e.g., circuit, electronic system, or both), or a machine) including an integrated circuit die, a voltage regulator located on the integrated circuit die and coupled to a first power supply node, and power switching circuitry located on the integrated circuit die and coupled to the first power supply node and a second power supply node, the power switching circuitry including transistors coupled in parallel between the first and second power supply nodes, and a controller to provide a first voltage, a second voltage, and a third voltage to gates of the transistors based on digital information, the first, second, and third voltages having different values based on values of the digital information.

In Example 12, the subject matter of Example 11 may optionally include, further comprising first additional transistors coupled in parallel between the first and second power supply nodes, and a first circuit path coupled to a node of the controller to propagate a signal from the node of the controller to gates of the first additional transistors.

In Example 13, the subject matter of Example 12 may optionally include, further comprising second additional transistors coupled in parallel between the first and second power supply nodes, and a second circuit path different from the first circuit path, the second circuit path coupled to the node of the controller to propagate the signal from the node of the controller to gates of the second additional transistors.

In Example 14, the subject matter of Example 13 may optionally include, wherein each of the first and second circuit paths includes buffers coupled in series.

In Example 15, the subject matter of any of Examples 11-14 may optionally include, wherein the controller is to provide a first digital value of the digital information, a second digital value of the digital information, and third digital value of the digital information, and the values of the first, second, and third voltages are based on respective first, second, and third values of the digital information.

In Example 16, the subject matter of any of Examples 11-14 may optionally include, wherein the second power supply node is coupled to a functional unit, and the controller is to provide the first, second, and third voltages to the gates of the transistors when the functional unit changes from a lower power consumption state to a higher power consumption state.

In Example 17, the subject matter of any of Examples 11-14 may optionally include, further comprising a power delivery path to couple to a battery, wherein the voltage regulator includes an input node coupled to the power delivery path.

In Example 18, the subject matter of any of Examples 11-14 may optionally include, wherein the integrated circuit die includes a processor.

In Example 19, the subject matter of any of Examples 11-14 may optionally include, further comprising an antenna coupled to the integrated circuit die.

Example 20 includes subject matter (such as a method of operating a device, an electronic apparatus (e.g., circuit, electronic system, or both), or a machine) including providing first, second, and third digital information to a controller located on an integrated circuit die, the controller coupled to transistors located on the integrated circuit die, the transistors coupled in parallel between a first power supply node and a second power supply node, applying a first voltage to gates of the transistors based on the first digital information, applying a second voltage to the gates of the transistors based on the second digital information, and applying a third voltage to the gates of the transistors based on the third digital information.

In Example 21, the subject matter of Example 20 may optionally include, wherein the first voltage has a first value, the second voltage has a second value, the third voltage has a third value, the first value is greater than the second value, and the second value is greater than the third value.

In Example 22, the subject matter of Example 21 may optionally include, wherein the first voltage is applied to the gates of the transistors before the second voltage is applied to the gates of the transistors, and the second voltage is applied to the gates of the transistors before the third voltage is applied to the gates of the transistors.

In Example 23, the subject matter of Example 20 may optionally include, further comprising selecting the first voltage from a resistive ladder network based on the first digital information, selecting the second voltage from the resistive ladder network based on the second digital information, and selecting the third voltage from the resistive ladder network based on the third digital information.

In Example 24, the subject matter of Example 20 may optionally include, further comprising applying a fourth voltage to gates of additional transistors coupled in parallel between the first and second power supply nodes.

In Example 25, the subject matter of Example 20 may optionally include, wherein the second power supply node is coupled to a functional unit, and the first, second, and third voltages are applied to the gates of the transistors during a time interval when the functional unit changes from a lower power consumption state to a higher power consumption state.

Example 26 includes subject matter (such as a device, an electronic apparatus (e.g., circuit, electronic system, or both), or machine) including means for performing any of the methods of claims 20-25.

The subject matter of Example 1 through Example 26 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a first power supply node;
a second power supply node;
transistors coupled in parallel between the first and second power supply nodes;
a controller to provide a first voltage, a second voltage, and a third voltage to gates of the transistors based on digital information, the first, second, and third voltages having different values based on values of the digital information;
first additional transistors coupled in parallel between the first and second power supply nodes; and
first buffers coupled in series with an output of the controller, each of the first buffers including an output node coupled to a gate of one of the first additional transistors.

2. The apparatus of claim 1, further comprising:
second additional transistors coupled in parallel between the first and second power supply nodes; and
second buffers coupled in series with the output of the controller in parallel with the first buffers, each of the second buffers including an output node coupled to a gate of one of the second additional transistors.

3. An apparatus comprising:
a first power supply node;
a second power supply node;
transistors coupled in parallel between the first and second power supply nodes; and
a controller to provide a first voltage, a second voltage, and a third voltage to gates of the transistors based on digital information, the first, second, and third voltages having different values based on values of the digital information, wherein in the controller includes a generator to generate the first, second, and third voltages, and a selector to receive the digital information and select the first, second, and third voltages provided to the gates of the transistors based on different values of the digital information.

4. The apparatus of claim 3, wherein the second power supply node is coupled to a functional unit, and the controller is to provide the first, second, and third voltages to the gates of the transistors when the functional unit changes from a first power consumption state to a second power consumption state.

5. The apparatus of claim 4, wherein the transistors are to turn off during the first power consumption state and to turn on in the second power consumption state.

6. The apparatus of claim 4, wherein the first power consumption state includes a sleep mode of the functional unit.

7. An apparatus comprising:
a first power supply node;
a second power supply node;
transistors coupled in parallel between the first and second power supply nodes; and
a controller to provide a first voltage, a second voltage, and a third voltage to gates of the transistors based on digital information, the first, second, and third voltages having different values based on values of the digital information, wherein the controller includes a resistive network coupled to the first power supply node and a ground node, the resistive network including a first node to provide the first voltage, a second node to provide the second voltage, and a third node to provide the third voltage.

8. The apparatus of claim 7, wherein the controller includes a selector including input nodes coupled to respective first, second, and third nodes of the resistive network, an output node coupled to the gates of the transistors, and nodes to receive bits of the digital information.

9. The apparatus of claim 8, wherein the selector includes first, second, and third transmission gates coupled to the first, second, and third nodes, respectively, of the resistive network.

10. An apparatus comprising:
an integrated circuit die;
a voltage regulator located on the integrated circuit die and coupled to a first power supply node; and
power switching circuitry located on the integrated circuit die and coupled to the first power supply node and a second power supply node, the power switching circuitry including:
transistors coupled in parallel between the first and second power supply nodes;
a controller to provide a first voltage, a second voltage, and a third voltage to gates of the transistors based on digital information, the first, second, and third voltages having different values based on values of the digital information;
first additional transistors coupled in parallel between the first and second power supply nodes; and
a first circuit path coupled to a node of the controller to propagate a signal from the node of the controller to gates of the first additional transistors.

11. The apparatus of claim 10, further comprising:
second additional transistors coupled in parallel between the first and second power supply nodes; and
a second circuit path different from the first circuit path, the second circuit path coupled to the node of the controller to propagate the signal from the node of the controller to gates of the second additional transistors.

12. The apparatus of claim 11, wherein each of the first and second circuit paths includes buffers coupled in series.

13. The apparatus of claim 10, wherein the controller is to provide a first digital value of the digital information, a second digital value of the digital information, and third digital value of the digital information, and the values of the first, second, and third voltages are based on respective first, second, and third values of the digital information.

14. The apparatus of claim 10, wherein the second power supply node is coupled to a functional unit, and the controller is to provide the first, second, and third voltages to the gates of the transistors when the functional unit changes from a lower power consumption state to a higher power consumption state.

15. The apparatus of claim 10, further comprising a power delivery path to couple to a battery, wherein the voltage regulator includes an input node coupled to the power delivery path.

16. The apparatus of claim 10, wherein the integrated circuit die includes a processor.

17. The apparatus of claim 10, further comprising an antenna coupled to the integrated circuit die.

18. A method comprising:
providing first, second, and third digital information to a controller located on an integrated circuit die, the controller coupled to transistors located on the integrated circuit die, the transistors coupled in parallel between a first power supply node and a second power supply node;
applying a first voltage to gates of the transistors based on the first digital information;
applying a second voltage to the gates of the transistors based on the second digital information;
applying a third voltage to the gates of the transistors based on the third digital information;
selecting the first voltage from a resistive ladder network based on the first digital information;
selecting the second voltage from the resistive ladder network based on the second digital information; and
selecting the third voltage from the resistive ladder network based on the third digital information.

19. The method of claim 18, wherein the first voltage has a first value, the second voltage has a second value, the third voltage has a third value, the first value is greater than the second value, and the second value is greater than the third value.

20. The method of claim 19, wherein the first voltage is applied to the gates of the transistors before the second voltage is applied to the gates of the transistors, and the second voltage is applied to the gates of the transistors before the third voltage is applied to the gates of the transistors.

21. A method comprising:
providing first, second, and third digital information to a controller located on an integrated circuit die, the controller coupled to transistors located on the integrated circuit die, the transistors coupled in parallel between a first power supply node and a second power supply node;
applying a first voltage to gates of the transistors based on the first digital information;
applying a second voltage to the gates of the transistors based on the second digital information;
applying a third voltage to the gates of the transistors based on the third digital information;
applying a fourth voltage to gates of additional transistors coupled in parallel between the first and second power supply nodes.

22. The method of claim 21, wherein the second power supply node is coupled to a functional unit, and the first, second, and third voltages are applied to the gates of the transistors during a time interval when the functional unit changes from a lower power consumption state to a higher power consumption state.

* * * * *